(12) United States Patent
Huang et al.

(10) Patent No.: US 6,198,171 B1
(45) Date of Patent: Mar. 6, 2001

(54) THERMALLY ENHANCED QUAD FLAT NON-LEAD PACKAGE OF SEMICONDUCTOR

(75) Inventors: Chien-Ping Huang, Hsinchu Hsien; Eric Ko, Taichung Hsien, both of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/475,003

(22) Filed: Dec. 30, 1999

(51) Int. Cl.[7] ................................................. H01L 23/48
(52) U.S. Cl. ........................ 257/787; 257/676; 257/707; 257/675
(58) Field of Search .................................. 257/787, 676, 257/707, 675, 666

(56) References Cited

U.S. PATENT DOCUMENTS

| | | | |
|---|---|---|---|
| 5,302,849 | * | 4/1994 | Cabvasin . |
| 5,521,429 | * | 5/1996 | Aono et al. . |
| 5,900,676 | * | 5/1999 | Kweon et al. . |
| 5,973,388 | * | 10/1999 | Chew et al. . |
| 5,977,613 | * | 11/1999 | Takata et al. . |
| 6,025,640 | * | 2/2000 | Yagi et al. . |
| 6,075,284 | * | 6/2000 | Choi et al. . |

* cited by examiner

Primary Examiner—Sheila V. Clark
(74) Attorney, Agent, or Firm—Jiawei Huang; J C Patents

(57) ABSTRACT

A thermally enhanced quad flat non-lead package of semiconductor comprises a chip a plurality of leads, and a molding compound. The chip has its active surface bonded to the top surface of the die pad, and the area of the die pad is smaller than that of the chip in order to expose the bonding pads on the active surface of the chip. The leads are disposed at the periphery of the die pad wherein the bottom surface of the lead has a stepped structure with a relatively thin portion to form a wire-bonding protruded zone. A plurality of bonding wires is used to electrically connect the wire-bonding protruded zone of the leads to the bonding pads of the chip. The molding compound encapsulates the chip, bonding wires, the die pad, and a portion of the surface of the leads, but exposes the bottom surface of the die pad. In this way, the encapsulating process makes the side surface of the lead, and the portion excluding the wire-bonding protruded zone of the bottom surface of the lead exposed in order to make the lead become the external connecting points of the package structure.

6 Claims, 4 Drawing Sheets

THERMALLY ENHANCED QUAD FLAT NON-LEAD PACKAGE OF SEMICONDUCTOR

BACKGROUND OF THE INVENTION

1. Field of the Invention

This invention relates to a "thermally enhanced quad flat non-lead package" of semiconductor., and more particularly to a "thermally enhanced quad flat non-lead package of semiconductor" for improving the heat-dissipating effect of the package.

2. Description of Related Art

In the information explosion of the world nowadays, the integrated circuit has become indispensable in our daily life, regardless of our daily life in food, clothing, lodging, transportation, education, and entertainment, the product assembled by various integrated circuit devices can be found everywhere. Following the evolution of the electronic technology, more sophisticate electronic products with user friendly and complicated functions are continuously progressing and changing. Nevertheless, in order to provide an ongoing convenience and comfortable usage, all the products are heading for the design trend of "Light, Thin, Short, and Small". In additions, the fabrication process of semiconductor has stepped into the mass production era of 0.18 μm integrated circuit, and semiconductor products with even higher integration have become at hands easily. As for packaging technology of the back stage, there are many successful cases on the development of precise package structure, i.e. chip scale package (CSP), wafer level package, and Multi-Chip Module (MCM) etc. However, in the respect of the assembly technology of devices, there is also a multi-level printed circuit board (PCB) with even higher density which make the integrated circuit (IC) package even closely and densely dispose on the printed circuit board.

FIG. 1 is a cross-sectional view of a Quad Flat Non-Lead package of a semiconductor according to the prior art and FIG. 2 is a bottom view corresponding to FIG. 1 according to the prior art. As shown in FIG. 1 and FIG. 2, the structure of the Quad Flat Non-Lead package which has disclosed in the U.S. Pat. No. 5,942.794 (Matsushita, 1999) is constructed on a lead frame and is having a die pad 100 surrounded by a plurality of leads 102. The chip 104 includes an active surface 106 and a back surface 108. And a plurality of bonding pads 110 for external connections of the chip 104 is set up on the active surface 106. The chip 104 has its back surface 108 bonded to the die pad 100 by the use of an adhesive 112 while the bonding pads 110 are electrically connected to the top surface 118a of the leads 102 by the use of bonding wires 114. What is more, the molding compound 116 normally encapsulates the whole chip 104, die pad 100, bonding wire 114, and the top surface 118a of the lead 102 while exposes the bottom surface 118b and the side surface 118c of the leads 102. The leads 102 are used for external connections of the whole package structure 120.

In the conventional structure of the Quad Flat Non-Lead package, the die pad 100 is upward offset in order to make the chip 104 and leads 102 positioned at different level of surfaces. An object of the upward offset of the die pad 100 is that the package can be applied in a relatively large chip in order to increase the packaging density, while the other object is to increase the bondability between the molding compound 116 and the lead frame. However, because of the demand for diminishing the thickness of the package, this conventional package structure is apt to expose the bonding wire 114 while encapsulating, thereby, the yield of the product become lower. Additionally, as the operating speed of the device of the integrated circuit becomes faster and faster nowadays. the heat generated increases accordingly, and since the conventional package structure is unable to provide a better way of heat dissipation, the performance of the electronic device will be affected.

SUMMARY OF THE INVENTION

Therefore, it is the first objective of the present invention to provide a thermally enhanced quad flat non-lead package to improve the heat-dissipating effect of the package.

It is the second objective of the present invention to provide a thermally enhanced quad flat non-lead package capable of raising the yield.

It is the third objective of the present invention to provide a Quad Flat Non-Lead package to increase the packaging density.

In order to attain the foregoing and other objectives, the present invention provides a thermally enhanced quad flat non-lead package of semiconductor that comprises a chip, a plurality of leads, and a molding compound. The chip has its active surface bonded to the top surface of the die pad, and the area of the die pad is smaller than that of the chip in order to expose the bonding pads on the active surface of the chip. The leads are disposed at the periphery of the die pad wherein the bottom surface of the lead has a stepped structure with a relatively thin portion to form a wire-bonding protruded zone. A plurality of bonding wires is used to electrically connect the wire-bonding protruded zone of the leads to the bonding pads of the chip. The molding compound encapsulates the chip, bonding wires, the die pad, and a portion of the surface of the leads, but exposes the bottom surface of the die pad. In this way, the encapsulating process makes the side surface of the lead, and the portion excluding the, vire-bonding protruded zone of the bottom surface of the lead exposed in order to make the lead become the external connecting points of the package structure.

According to a preferred embodiment of the present invention, the back surface of the chip can add a heat spreader to further improve the heat-dissipating effect.

Furthermore, in order to attain the foregoing and other objectives. the present invention also provides a stacked-chip thermally enhanced quad flat non-lead package that comprises a first chip and a second chip bonded back to back each other. The first chip has a first active surface and a first back surface while the second chip has a second active surface and a second back surface. A die pad having an area smaller than that of the first chip is bonded to the first active surface of the first chip, and the bonding pad of the first chip is exposed. A plurality of leads is disposed at the periphery of the die pad with its bottom surface appears a stepped structure which make each of the leads form a protruded wire-bonding protruded zone with a relatively thin portion.

The leads are electrically connected to the bonding pads of the first chip and the second chip respectively. The bonding pads of the first chip are connected to the protruded wire-bonding protruded zone of the bottom surfaces of the leads while the bonding pads of the second chip are connected to the top surface of the leads. Then, a molding compound is used to encapsulate the first chip, the second chip, the die pad, the bonding wires, and a portion of the surface of the lead but to expose the bottom surface of the die.pad. In additions, a portion of the bottom surface excluding the protruded wire-bonding protruded zone is also exposed.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1:
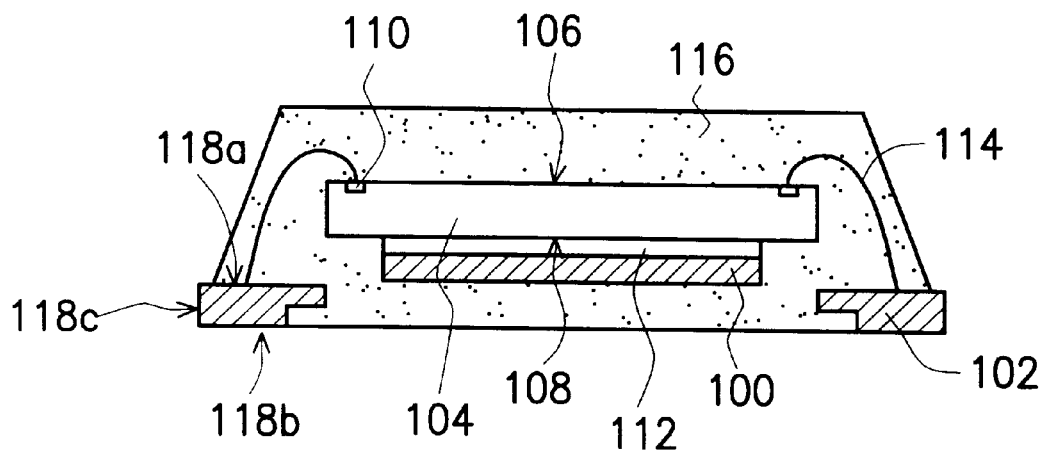
FIG. 1 is a cross-sectional view of a quad flat non-lead package of semiconductor according to a prior art.
Figure 2:
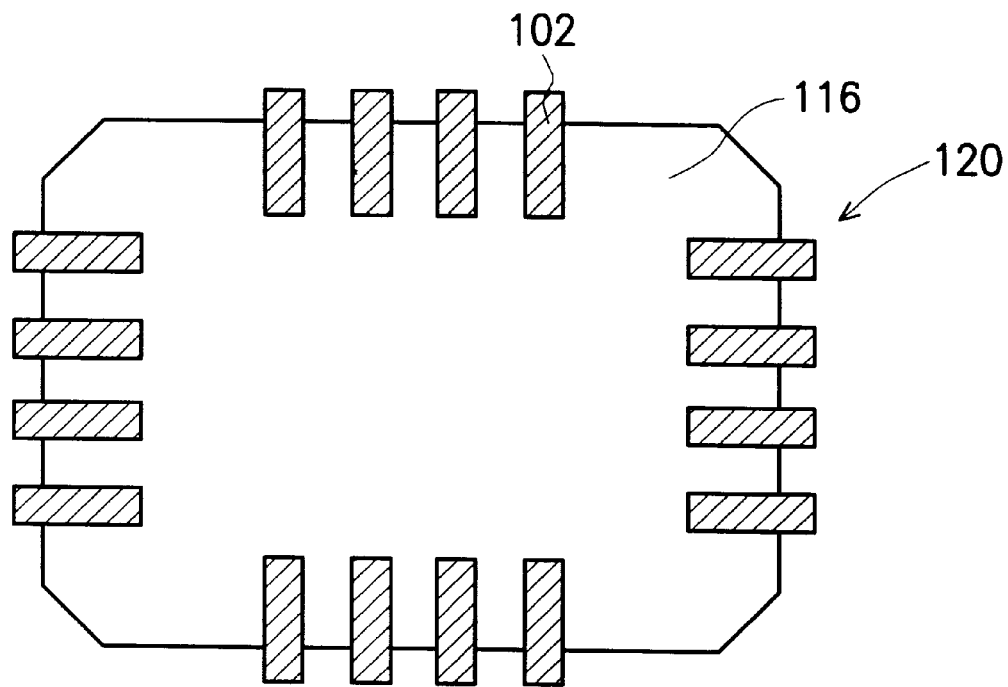
FIG. 2 is a bottom view corresponding to FIG. 1 according to the prior art.
Figure 3:
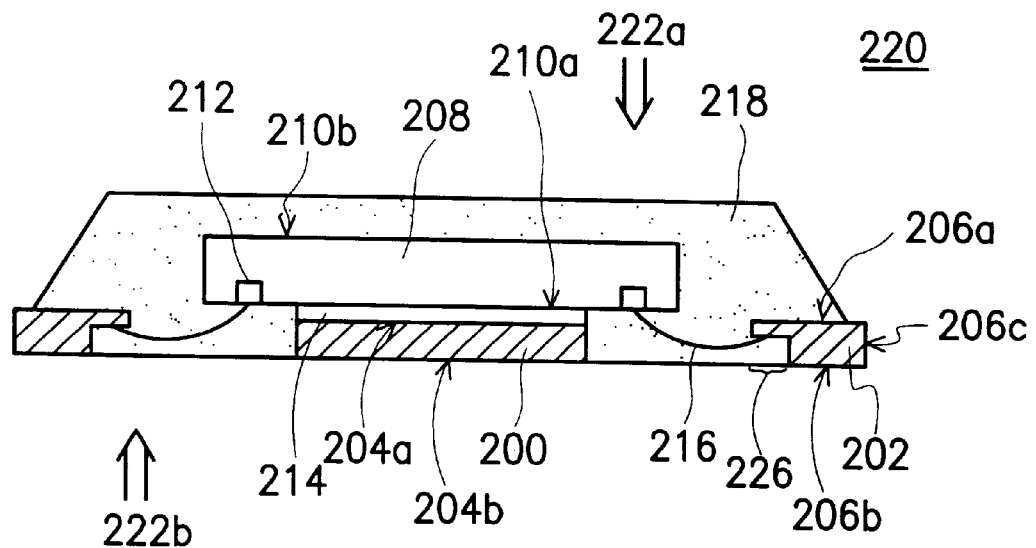
FIG. 3 is a cross-sectional view of a thermally enhanced quad flat non-lead package of the first preferred embodiment of the present invention.
Figure 4:
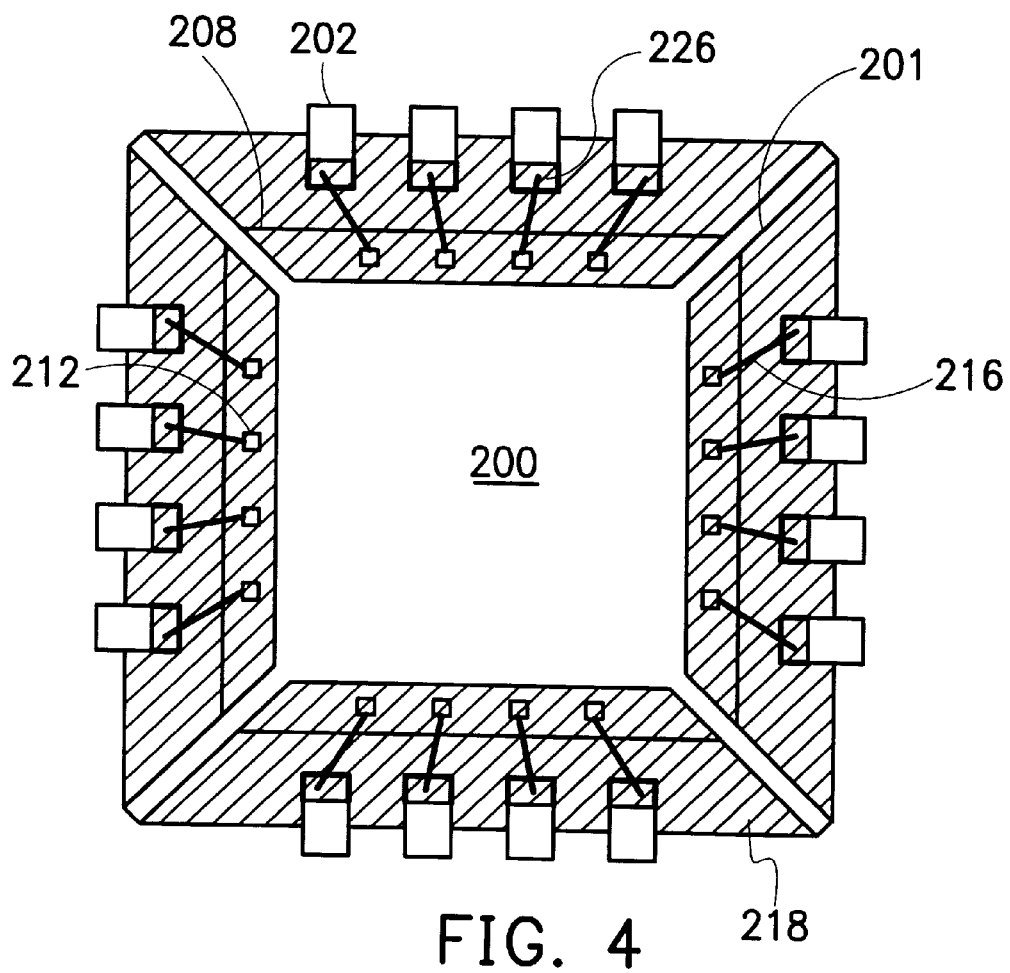
FIG. 4 is a bottom view corresponding to FIG. 3 of the present invention.

Shown in FIG. 3 is a cross-sectional view of a thermally enhanced quad flat nonlead package of the first preferred embodiment of the present invention while FIG. 4 is a bottom view corresponding to FIG. 3 of the present invention. As shown in FIG. 3. and FIG. 4, a thermally enhanced quad flat non-lead package of semiconductor of the present invention is constructed on a lead frame that is constituted by a die pad 200 and a of leads 202 disposed on the periphery of the lead frame. The die pad 200 has a first surface 204a and a second surface 204b while the lead 202 has a first surface 206a and a second surface 206b. The die pad 200 and the leads 202 are coplaner, that is, the second surface 204b of the die pad 200 and the second surface 206b of the leads 202 are coplaner wherein the die pad 200 is connected to the lead frame by a support bar 201. The chip 208 has an active surface 210a and a corresponding back surface 210b wherein a plurality of bonding pads 212 used for external connections for the electronic circuit in the chip 208 are set up on the active surface 210a.

In the present invention, the area of the die pad 200 is small than that of the chip 208. The first surface 204a of the die pad 200 is bonded to the active surface 210a of the chip 208 through an adhesive 214 while those bonding pads 212 are exposed. A well heat-conductive and electrically insulated material is a preferred one for the adhesive 214. To facilitate the wire bonding, the second surface 206b of the lead 202 appears a stepped structure and is formed a relatively thin wire-bonding protruded zone 226. The bonding pads 212 are electrically connected to the leads 202 respectively at the wire-bonding protruded zone 226 on the second surface 206b of the leads 202 by means of bonding wire 216 such as gold wire, aluminum wire etc. Finally, a molding compound 218 is used to encapsulate the chip 208, the die pad 200, the bond wire 216, the first surface 206a of the lead 202, as well as the wire-bonding protruded zone 226 on the second surface 206b of the lead 202. But the second (bottom) surface 204b of the die pad 200 is exposed. An overall package structure 220 is thus formed wherein the package structure 220 has a first side 222a (top surface) and a second side 222b (bottom surface).

Since the die pad 200. which is bonded to the active surface 210a of the chip 208, provides the bonding wires 216 with accommodating space to assure the bond wires without being exposed, the product yield can be increased. In additions, since the devices on the chip 208 are formed on the active surface 210a that is the primary source of heat generation, the heat accumulated on the chip 208 can be dissipated directly to the die pad 200 through the heat-conductive adhesive 214. Moreover, the second surface 204b of the die pad 200 are exposed on the second side 222b of the package structure 220 to enhance the heat-dissipating effect. Besides, since the area of the die pad 200 is smaller than that of the chip 208, the delamination problem resulted from the difference in the coefficient of thermal expansion (CTE) between the die pad 200 and the chip 208 can be reduced, thereby, the product reliability can be increased.

A portion of the second surface 206b (bottom surface) excluding the wire-bonding protruded zone 226 of the lead 202 is exposed on the second side 222b of the package structure 200 for external connections. Besides, the side surface 206c of the lead 202 can be exposed to the side edge of the package structure 220. The stepped structure in the wire-bonding protruded zone 226 can be formed by the use of half etching or coin methods to reduce the thickness of a portion of the lead 202 to increase the encapsulating area of the molding compound 218 on the surfaces of the lead 202.

Figure 5:
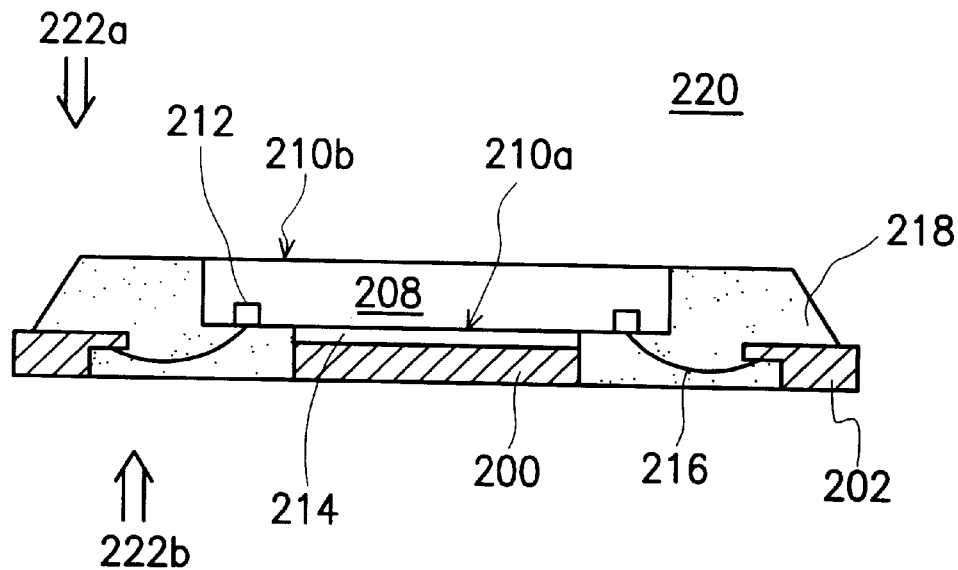
FIG. 5 is a cross-sectional view of a thermally enhanced quad flat non-lead package of the second preferred embodiment of the present invention.

FIG. 5 is a cross-sectional view of a thermally enhanced quad flat non-lead package of the second preferred embodiment of the present invention. As shown in the FIG. 5, in order to increase further the heat-dissipating efficiency of the thermally enhanced quad flat non-lead package according to FIG. 3, the back surface 210b of the chip 208 can be exposed to the first side 222a of the package structure 220.

Figure 6:
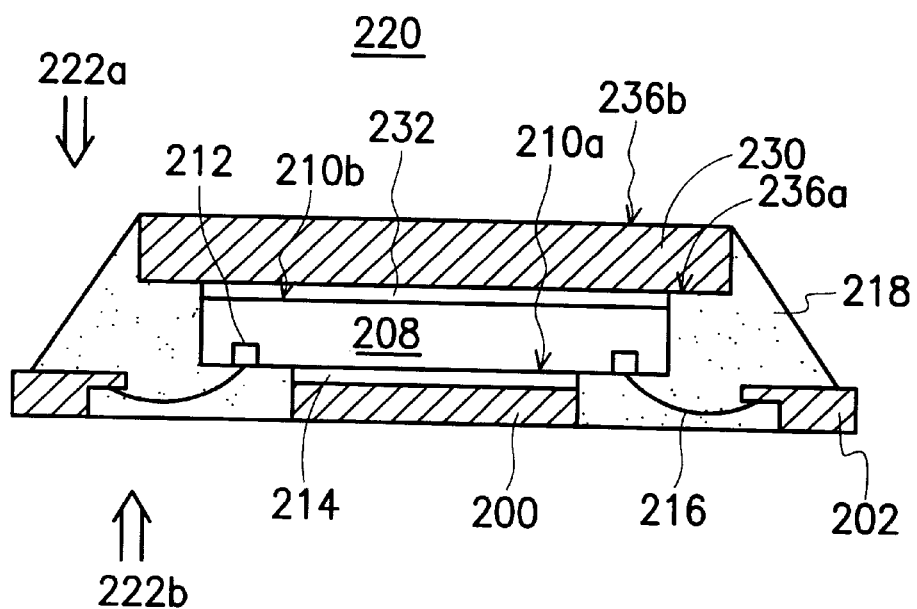
FIG. 6 is a cross-sectional view of a thermally enhanced quad flat non-lead package of the third preferred embodiment of the present invention.

FIG. 6 is a cross-sectional view of a thermally enhanced quad flat non-lead package of the third preferred embodiment of the present invention. As shown in FIG. 6, the third preferred embodiment of the thermally enhanced quad flat non-lead package of the present invention can further improve its heat-dissipating efficiency by adding a heat spreader 230 on the back surface 210b of the chip 208. One surface 236a of the heat spreader 230 is bonded to the back surface 210b of the chip 208 by the use of a relatively better heat-conductive adhesive 232 while the other surface 236b is exposed on the first side 222a of the package structure 220.

Figure 7:
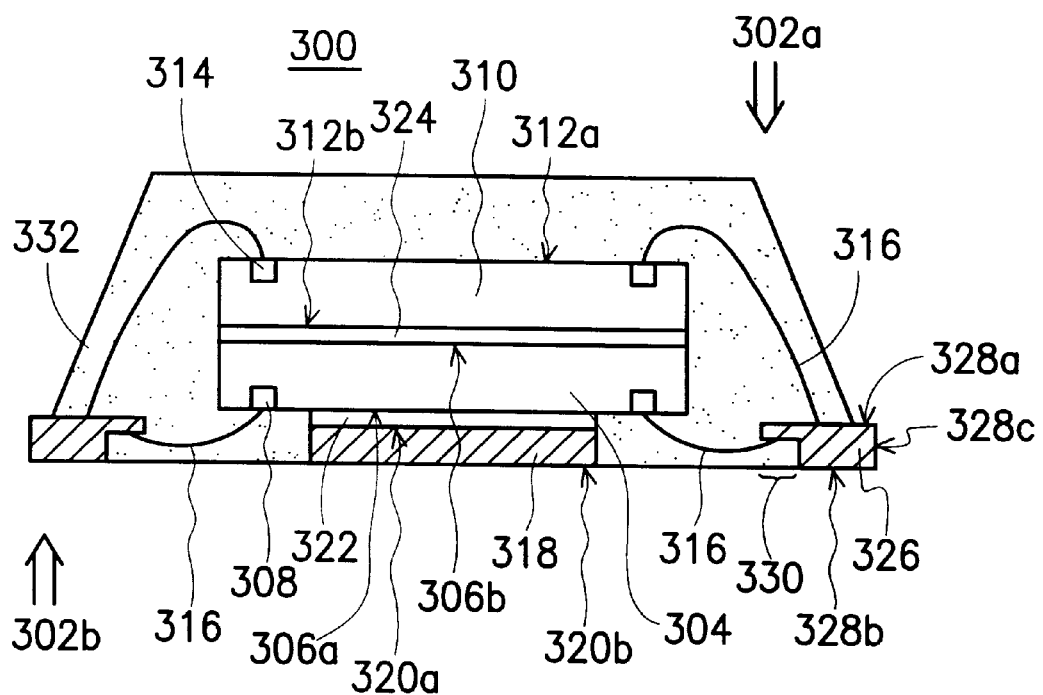
FIG. 7 is a cross-sectional view of a thermally enhanced quad flat non-lead package of the fourth preferred embodiment of the present invention.

FIG. 7 is a cross-sectional view of a thermally enhanced quad flat non-lead package of the fourth preferred embodiment of the present invention. As shown in FIG. 7, the package structure of the present invention can also be applied in a package having stacked chips. The fourth preferred embodiment of the present invention comprises a first chip 304 and a second chip 310. The first chip 304 has a first active surface 306a and a first back surface 306b while the second chip 310 has a second active surface 312a and a second back surface 312b. The first chip 304 and the second chip 310 are bonded each other on their corresponding first back surface 306b and second back surface 312b respectively by the use of an adhesive 324. The die pad 318 with its area smaller than that of the first chip 304 has its first surface 320a bonded to the active surface 306a of the first chip 304 by an adhesive 322 wherein the first chip 304 has the first bonding pads 308 exposed. The lead 326 has a first surface 328a and a second surface 328b wherein the second surface 328b of the lead 326 appears a stepped structure to form a protruded wire-bonding protruded zone 330 having relatively thin in thickness in order to facilitate the wire-bonding work. The first bonding pads 308 on the active surface 306a of the first chip 304 are electrically connected to the wire-bonding protruded zone 330 on the second surface 328b of the leads 326 respectively by the bonding wires 316. Likewise, the second bonding pads 314 on the second active surface 312a of the second chip 310 are electrically connected to the first surface 328a of the leads 326 respectively by the bonding wires 316.

The molding compound 332 encapsulates the first chip 304, the second chip 310, the bonding wires 316, the die pad 318, the first surface 328a of the lead 326, and the protruded wire-bonding protruded zone 330 of the second surface 328b of the lead 326. In this way the encapsulating process constitutes a package structure 300 which has a first side 302a and a second side 302b. In order to improve the heat-dissipating effect, the second surface 320b of the die pad 318 can be exposed on the second side 302b of the package structure 300. As for the lead 326, the second surface 328b excluding the area of the protruded wire bonding portion 330 is exposed on the second side 302b of the package structure 300. The side surface 328c of the lead 326 is also exposed at the side edge of the package structure 300. The purpose of exposing these surfaces of the leads 326 is to form the external connections of the package structure 300.

To summarize the foregoing illustration disclosed by preferred embodiments of the present invention, the thermally enhanced quad flat non-lead package of semiconductor of the present invention comprise the following advantages:

1. The thermally enhanced quad flat non-lead package of semiconductor of the present invention can lower the heat resistance to improve the heat-dissipating effect. This is because that the die pad is directly bonded to the active surface of the chip.
2. The thermally enhanced quad flat non-lead package of semiconductor of the present invention can improve the heat-dissipating effect of the package structure to further increase the performance of the device. This is because that the thermally enhanced quad flat non-lead package can optionally select to expose the die pad or the back surface of the chip or add a heat spreader.
3. The Quad Flat Non-Lead package of semiconductor of the present invention can provide the accommodating space for the bonding wire to reduce the overall thickness of the package without exposing the bonding wires while performing encapsulating. Therefore, the package can increase the yield of the product since the die pad is bonded to the active surface of the chip.
4. The thermally enhanced quad flat non-lead package of semiconductor of the present invention can contain two chips in the same quad flat non-lead package while providing good ways of heat-dissipating, thereby, the package can increase the density of packaging and can improve the performance of the device.

The invention has been described using an exemplary preferred embodiment. However. it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A thermally enhanced quad flat non-lead package of semiconductor comprising:

a chip, having an active surface and a corresponding back surface wherein the active surface comprises a plurality of bonding pads;

a die pad, having a first surface and a corresponding second surface wherein the area of the die pad is smaller than the area of the chip, and the die pad has the first surface bonded to the active surface of the chip while those bonding pads on the active surface of the chip are exposed;

a plurality of leads, disposed at the periphery of the die pad, and having a first surface and a corresponding second surface wherein the second surface appears a stepped structure which make each of the leads have a relatively thin wire-bonding protruded zone, and the second surface of the die pad and the second surface of the lead are coplaner;

a plurality of bonding wires, electrically connected to those bonding pads and to the wire-bonding protruded zone of the second surface of those leads respectively; and a molding compound, encapsulating the chip, the die pad, the first surface of those leads, the wire-bonding protruded zone, and those bonding wires but leaving the second surface of the die pad exposed in order to form a package structure, and the package structure comprises a first side and a second side wherein the molding compound exposes at least the portion excluding the wire-bonding protruded zone on the second surface of those leads at the second side of the package structure.

2. The thermally enhanced quad flat non-lead package of semiconductor of claim 1 wherein the molding compound further exposes the back surface of the chip on the first side of the package structure.

3. The thermally enhanced quad flat non-lead package of semiconductor of claim 1 wherein the molding compound further exposes the side surface of the lead at the side edge of the package structure.

4. The thermally enhanced quad flat non-lead package of semiconductor of claim 1 further comprising a heat spreader wherein a surface of the heat spreader is bonded to the back surface of the chip while the other surface exposes on the first side of the package structure.

5. A thermally enhanced stacked quad flat non-lead package of semiconductor comprising:

a first chip, having a first active surface and a corresponding first back surface wherein the first active surface comprises a plurality of first bonding pads;

a second chip, having a second active surface and a corresponding second back surface wherein the second active surface comprises a plurality of second bonding pads, and the first back surface of the first chip is bonded to the second back surface of the second chip a die pad, having a first surface and a corresponding second surface wherein the area of the die pad is smaller than the area of the first chip, and the die pad has the first surface bonded to the first active surface of the first chip, and those first bonding pads on the first active surface of the first chip and those second bonding pads on the second active surface of the second chip are exposed;

a plurality of leads, disposed at the periphery of the die pad, and having a first surface and a corresponding second surface wherein the second surface appears a stepped structure which make each of the leads have a relatively thin wire-bonding protruded zone, and the second surface of the die pad and the second surface of the lead are coplaner;

a plurality of bonding wires, electrically connected to those first bonding pads and to those second bonding pads respectively wherein those bonding wires connecting the first bonding pads are connected to the wire-bonding protruded zone of the second surface of those leads while those bonding wires connecting the second bonding pads are connected to the first surface of those leads; and a molding compound, encapsulating the first chip, the second chip, the die pad, the first surface of those leads, the wire-bonding protruded zone, and those bonding wires but leaving the second surface of the die pad exposed in order to form a package structure, and the package structure comprises a first side and a second side wherein the molding compound exposes at least the portion excluding the wire-bonding protruded zone on the second surface of those leads at the second side of the package structure.

6. The thermally enhanced stacked quad flat non-lead package of semiconductor of claim 5 wherein the molding compound further exposes the side surface of the lead at the side edge of the package structure.

* * * * *